United States Patent [19]

Lee et al.

[11] Patent Number: 5,506,157
[45] Date of Patent: Apr. 9, 1996

[54] METHOD FOR FABRICATING PILLAR BIPOLAR TRANSISTOR

[75] Inventors: Kyu-Hong Lee; Jin-Hyo Lee, both of Daejeon, Rep. of Korea

[73] Assignee: Electronics and Telecommunications Research Institute, Daejeon-shi, Rep. of Korea

[21] Appl. No.: 469,677

[22] Filed: Jun. 6, 1995

Related U.S. Application Data

[62] Division of Ser. No. 360,137, Dec. 20, 1994.

[51] Int. Cl.$^6$ ............................................. H01L 21/265
[52] U.S. Cl. .................... 437/31; 437/32; 437/33; 437/63; 437/67; 437/26; 257/518; 257/575; 257/576; 257/588; 148/DIG. 10; 148/DIG. 11; 156/633.1
[58] Field of Search .............................. 437/31, 67, 63, 437/33, 31, 32, 26; 188/DIG. 10, DIG. 11; 257/588, 575, 576, 518; 156/633.1

[56] References Cited

U.S. PATENT DOCUMENTS

| 4,157,269 | 6/1979 | Ning et al. ............................... 437/33 |
| 4,378,630 | 4/1983 | Horng et al. ............................ 29/580 |
| 4,693,782 | 9/1987 | Kikuchi et al. ......................... 437/33 |
| 4,764,001 | 8/1988 | McLaughlin et al. .................. 357/59 |
| 4,849,371 | 7/1989 | Hansen et al. .......................... 437/82 |
| 4,965,217 | 10/1990 | Desilets et al. ........................ 437/33 |
| 4,969,026 | 11/1990 | Van der Velden et al. ............ 357/34 |
| 5,061,645 | 10/1991 | Nakazato et al. ....................... 437/31 |
| 5,409,845 | 4/1995 | Robinson et al. ....................... 437/31 |

FOREIGN PATENT DOCUMENTS

| 84113062.8 | 5/1985 | European Pat. Off. . |
| 0215068 | 9/1988 | Japan ........................................ 437/31 |
| 5036712 | 2/1993 | Japan ........................................ 437/33 |

OTHER PUBLICATIONS

Chai et al, "A New Self–Aligned Bipolar Transistor Using Vertical Nitride Mask", IEDM 85, IEEE publication No. CH2252–5/85/0000–0026 (1985).

Primary Examiner—George Fourson
Assistant Examiner—Long Pham
Attorney, Agent, or Firm—Larson and Taylor

[57] ABSTRACT

Disclosed is a pillar bipolar transistor which has a bidirectional operation characteristic and in which a parasitic junction capacitance of a base electrode, and a method for fabricating the transistor comprises etching a substrate using a first patterned insulating layer as a mask to form first and second pillarss separated by a trench therein; injecting an impurity using a mask to form a collector under the first and second pillars and in the second pillar; depositing a first oxide layer and a first polysilicon layer thereon; polishing the first polysilicon layer using the first oxide layer as a polishing stopper; removing a portion of the first polysilicon layer and a portion of the first oxide layer to define an extrinsic base; etching the oxide layer formed on both sides of the first pillar to a predetermined depth to define a connecting portion and forming a buried polysilicon therein to form the connecting portion; depositing a second oxide layer and a second polysilicon layer thereon; polishing the second polysilicon layer using the second oxide layer as a polishing stopper; removing only the second oxide layer formed upward the first pillar to expose a surface of the first pillar; injecting an impurity in the first pillar to form a base at a center portion thereof; injecting an impurity to form an emitter at an upper portion of the first pillar; depositing a third polysilicon layer on the emitter, the third polysilicon layer being formed wider than the emitter; and forming self-aligned contact holes to form electrodes through the contact holes.

5 Claims, 4 Drawing Sheets

METHOD FOR FABRICATING PILLAR BIPOLAR TRANSISTOR

This is a division of U.S. application Ser. No. 08/360,137 filed Dec. 20, 1994.

BACKGROUND OF THE INVENTION

1. Field of the Invention

The present invention relates to a semiconductor device, and more particularly to a pillar bipolar transistor which has a bidirectional operation characteristic and in which a parasitic junction capacitance of a base electrode, and a method for fabricating the same.

2. Description of the Prior Art

As integration of a semiconductor device is improved, driving speed and current gain thereof are enhanced, but operation characteristic thereof is restricted somewhat.

FIG. 1 is a cross-sectional view showing the construction of a bipolar transistor which is fabricated by a prior art method.

This technique is that a parasitic junction capacitance of a collector 3, i.e. a parasitic junction capacitance between a substrate 1 and a buried collector 2, is reduced and a size of a bipolar transistor is further small.

In FIG. 1, reference numeral 6 indicates an insulating layer, reference numeral 7 indicates a base region, and reference numerals 8 and 9 indicate an emitter region and an electrode, respectively.

In the bipolar transistor of FIG. 1, since the base region 7 is wide and the emitter and base regions 8, 7 are jointed with each other at high concentration, there arises the problem that a power consumption is large.

Also, to enhance operation characteristic, the construction of a pillar bipolar transistor is disclosed in Europe Patent Application No. 84113062.8, as shown in FIG. 2.

With reference to FIG. 2, the method for fabricating the disclosed pillar bipolar transistor comprises the steps of selectively etching a single crystal semiconductor substrate 11 to form pillars therein, forming an emitter region 18, a base region 17, a collector region 13 and collector sinker region 15 in the pillars, isolating active regions by a buried insulating layer 16, and forming a polysilicon layer 14 as an extrinsic base region at both sides of one of the pillars to complete fabrication of a pillar bipolar transistor.

In the prior art pillar bipolar transistor fabricated by the above method, however, since the polysilicon layer 14 is connected with both sides of the pillar in which the base region 17 is formed, the base region 17 becomes further large. Thus, the operation characteristic of the pillar bipolar transistor is lowered.

Additionally, since the emitter and collector regions must be formed at an upper portion of the pillar, there arises the problem that it is extremely difficult to perform a self-aligned contact open process.

SUMMARY OF THE INVENTION

It is an object of the present invention to provide a pillar bipolar transistor which has a bidirectional operation characteristic and in which a parasitic junction capacitance between a base and a collector or between the base and an emitter can be reduced.

It is another object of the present invention to provide a method for fabricating a pillar bipolar transistor in which it is easy to form an extrinsic base region in electrical connection with a base region formed in a pillar and form a self-arranged contact opening for interconnection.

According to one aspect of the present invention, the pillar bipolar transistor, comprising a semiconductor substrate of a first conductivity type having at lease three trench regions, and first and second pillar structures formed between the trench regions; a collector region formed under the first and second pillar structures and in the second pillar structure, and doped with an impurity of a second conductivity type; an extrinsic base region buried in the trench regions; an oxide layer formed between the extrinsic base region and the substrate; an intrinsic base region of the first conductivity type formed at a center portion of the first pillar structure; a connecting portion formed between the extrinsic base region the intrinsic base region to electrically connect the extrinsic base region with the intrinsic base region; an emitter region of the second conductivity type formed at an upper portion of the first pillar structure; and electrodes formed through contact holes on the emitter, collector and base region.

In this transistor, the transistor further comprises a conductive thin film wider than the emitter so as to make formation of a contact hole easy.

In this transistor, the conductive thin film is composed of a polysilicon containing an impurity of the second conductivity type.

In this transistor, the extrinsic base region is composed of a polysilicon.

According to another aspect of the present invention, the method for fabricating a pillar bipolar transistor, the method comprising the steps of etching a silicon substrate of a first conductivity type using a first patterned insulating layer as a mask to form first and second pillar structures separated by a trench region therein; injecting an impurity of a second conductivity type using a second patterned insulating layer as a mask to form a collector region under the first and second pillar structures and in the second pillar structure; sequentially depositing a first oxide layer and a first polysilicon layer thereon; polishing the first polysilicon layer using the first oxide layer as a polishing stopper; removing a portion of the first polysilicon layer and a portion of the first oxide layer to define an extrinsic base region; etching the oxide layer formed on both sides of the first pillar structure to a predetermined depth to define a connecting portion and forming a buried polysilicon therein to form the connecting portion; sequentially depositing a second oxide layer and a second polysilicon layer thereon; polishing the second polysilicon layer using the second oxide layer as a polishing stopper; removing only the second oxide layer formed upward the first pillar structure to expose a surface of the first pillar structure; injecting an impurity of the first conductivity type in the first pillar structure to form a base region at a center portion thereof; injecting an impurity of the second conductivity type to form an emitter region at an upper portion of the first pillar structure; depositing a third polysilicon layer on the emitter region, the third polysilicon layer being formed wider than the emitter region; and forming self-aligned contact holes to form electrodes through the contact holes.

In this method, the step of etching the silicon substrate is performed using a difference of etching rate between the first patterned insulating layer and the silicon substrate.

In this method, the step of injecting the impurity of the second conductivity type is performed using a diffusion difference between the second patterned insulating layer and the silicon substrate.

In this method, the step of polishing the firs polysilicon layer is performed by a chemical-mechanical polishing utilizing a polishing speed difference between the first polysilicon layer and the first oxide layer.

According to a further aspect of the present invention, the method for fabricating a pillar bipolar transistor, comprising the steps of etching a silicon substrate of a first conductivity type using a first patterned insulating layer as a mask to form first and second pillar structures separated by a trench region therein; injecting an impurity of a second conductivity type using a second patterned insulating layer as a mask to form an emitter region under the first and second pillar structures and in the second pillar structure; sequentially depositing a first oxide layer and a first polysilicon layer thereon; polishing the first polysilicon layer using the first oxide layer as a polishing stopper; removing a portion of the first polysilicon layer and a portion of the first oxide layer to define an extrinsic base region; etching the oxide layer formed on both sides of the first pillar structure to a predetermined depth to define a connecting portion and forming a buried polysilicon therein to form the connecting portion; sequentially depositing a second oxide layer and a second polysilicon layer thereon; polishing the second polysilicon layer using the second oxide layer as a polishing stopper; removing the second oxide layer formed only upward the first pillar structure to expose a surface of the first pillar structure; injecting an impurity of the first conductivity type in the first pillar structure to form a base region at a center portion thereof; injecting an impurity of the second conductivity type to form a collector region at an upper portion of the first pillar structure; depositing a third polysilicon layer on the collector region, the third polysilicon layer being formed wider than the collector region; and forming self-aligned contact holes to form electrodes through the contact holes.

In the pillar bipolar transistor, the intrinsic base can be further reduced in size, because an electrical connection portion is provided between the intrinsic base and an extrinsic base.

Also, the active region can be formed in self-alignment, thereby allowing integration thereof to be enhanced. Parasitic junction capacitance between a base and a collector or between the base and an emitter can be reduced by forming the active region in self-alignment.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 1:
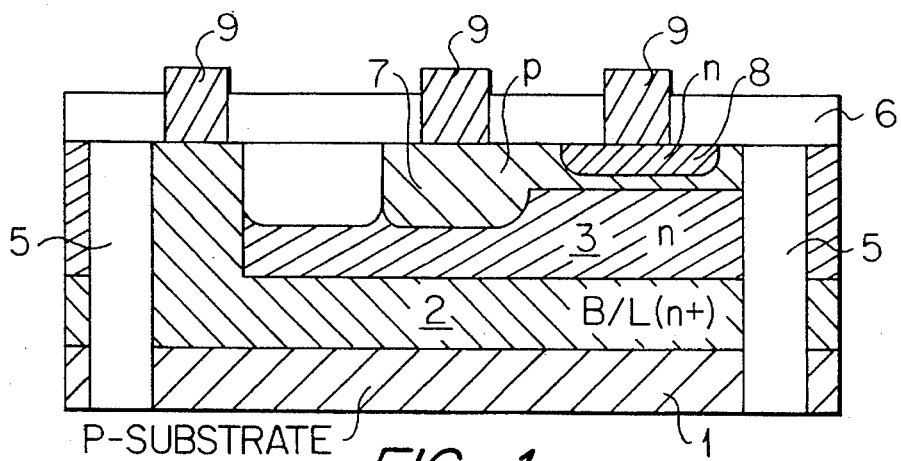
FIG. 1 is a cross-sectional view showing the construction of a bipolar transistor which is fabricated by a prior art method.
Figure 2:
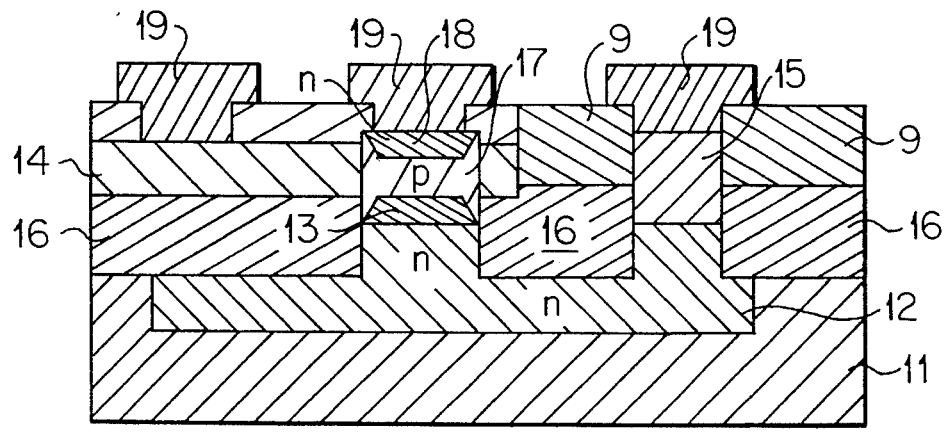
FIG. 2 is a cross-sectional view showing the construction of a pillar bipolar transistor which is fabricated by another prior art method.
Figure 3:
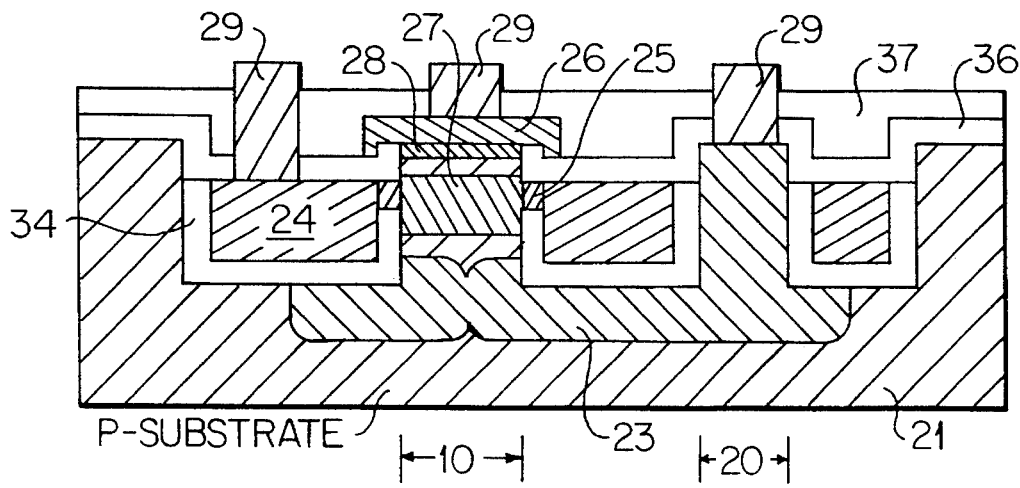
FIG. 3 is a cross-sectional view showing the construction of a pillar bipolar transistor which is fabricated by the method of the present invention.

FIG. 3 is a cross-sectional view of the pillar bipolar transistor which is fabricated in accordance with the present invention.

As shown in FIG. 3, a semiconductor substrate 21 is provided with a trench region having at least three recess portions, first and second pillar structures 10, 20 formed between the trench regions. Collector region (or, emitter region) is formed under the first and second pillar structures and in the second pillar structure, and a thin film for a base electrode or an extrinsic region 24 is composed of a polysilicon buried in the trench regions. Between the extrinsic base 24 and the substrate 21, an oxide layer 34 is formed. Also, at the center portion of the first pillar structure 10, a base region 27 of a first conductivity type is formed. A connection portion 25 is formed at both sides of the first pillar structure 10, and the emitter region (or the collector region) of a second conductivity type is formed at an upper portion of the first pillar structure 10. Each electrode is formed at a portion of each of the extrinsic base region 24, the emitter (or, collector) region 28, and the collector (or, emitter) 23.

In the pillar bipolar transistor as described above, a conductive thin film 26 wider than the emitter may be formed in order that a contact hole is easily provided for interconnection between the emitter (or, collector) 28 and the emitter electrode 29. The conductive thin film 26 is composed of a polysilicon containing an impurity of the second conductivity type.

Hereinafter, the method for fabricating the pillar bipolar transistor of FIG. 3 will be described in detail with reference to FIGS. 4A through 4K. In FIGS. 4A through 4K, component elements having similar functions to the component elements of the pillar bipolar transistor shown in FIG. 3 are indicated by the same reference numerals.

Figure 4A:
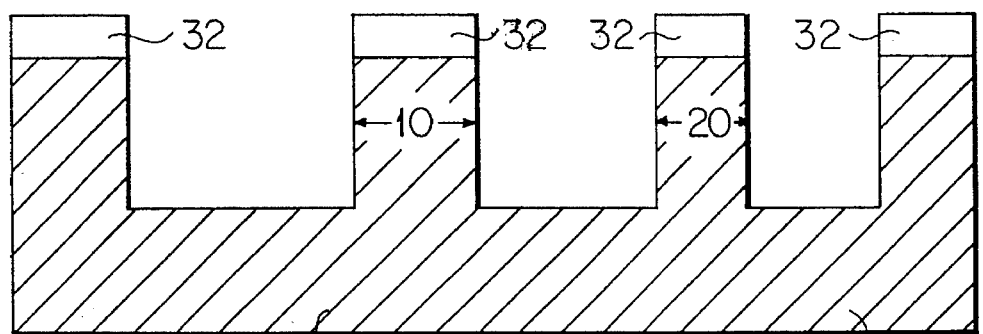
FIGS. 4A through 4K are cross-sectional views used for explaining the steps for fabricating the pillar bipolar transistor of FIG. 3 in accordance with the present invention.

Referring to FIG. 4A, on a p-type silicon substrate 21, an oxide layer is formed, and then a patterning of the oxide layer is performed to form a first patterned oxide layer 92 and define a trench region. Next, an anisotropic etching is performed using the first patterned oxide layer as an etching mask to form first and second pillar structures 10, 20 separated by the trench portion. In case of the etching, the substrate 21 is etched by a difference between etching rates of the first patterned oxide layer 92 and the substrate 21.

Figure 4B:
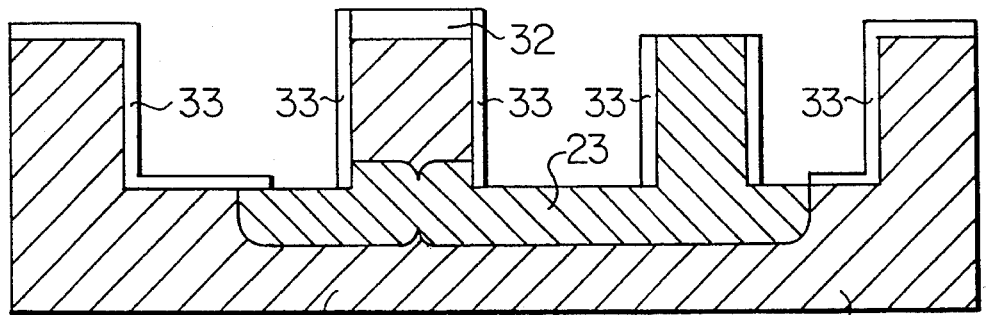

In FIG. 4B, after removal of the patterned oxide layer 92 other than the oxide layer formed only on the first pillar structure 10, an oxide layer is formed thereon, and then the oxide layer is patterned to form a second patterned oxide layer 33 and define a subcollector region. Next, using the second patterned oxide layer 33 as a mask, an impurity injection is carried out to form a collector layer 29 (or, emitter) injected with an impurity of a high concentration. In case of the impurity injection, the collector layer 23 is formed under the first and second pillar structures 10, 20 and in the second pillar structure 20 by using an impurity diffusion difference between the second patterned oxide layer 33 and the substrate 21.

Figure 4C:
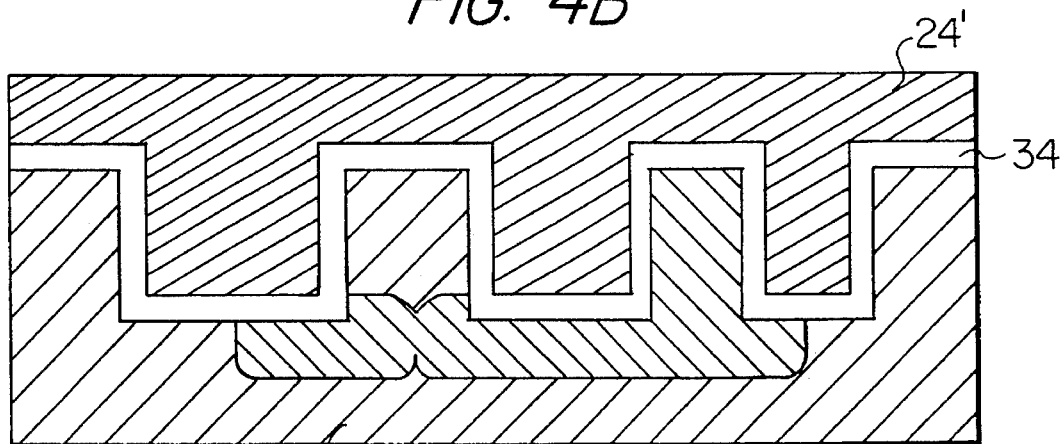
Figure 4D:
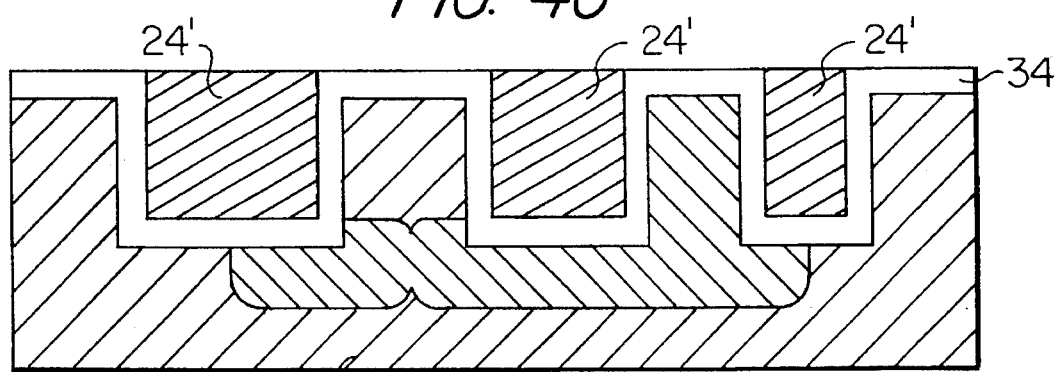

As shown in FIG. 4C, after removal of all the oxide layers 92, 33, an oxide layer 94 is formed thereon. A polysilicon layer 24' thicker than a step between the trench and the pillar structure is deposited thereon. Next, a chemical-mechanical polishing is performed to polish the polysilicon layer 24' up to a surface of the oxide layer 34, as shown in FIG. 4D. In the polishing for planarization, the oxide layer 34 is used as a polishing stopper.

Figure 4E:
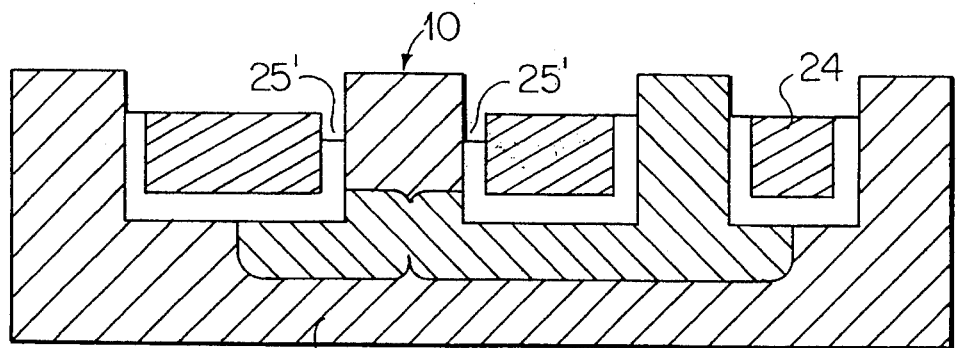
Figure 4F:
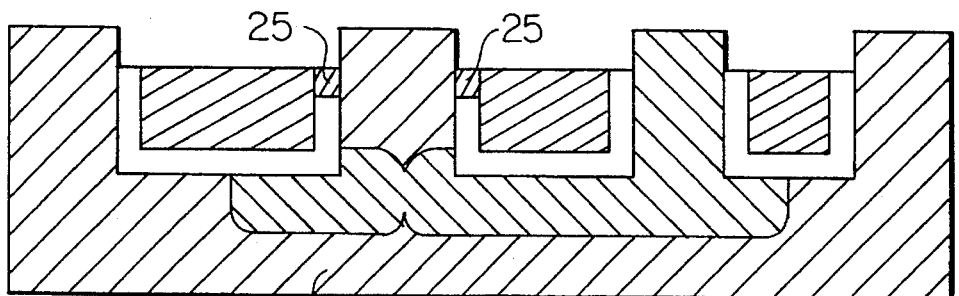

With reference to FIG. 4E, a dry-etching is carried out to remove a portion of the polysilicon layer 24' and a portion of the oxide layer 34. As a result, a thin film for a base electrode or an extrinsic base 24 is formed in the trench region. Next, only the oxide layer 34 formed on both sides of the first pillar structure 10 is selectively removed to define a connecting region 25' In the connecting region 25', a polysilicon layer is buried to form a connection portion 25 for electrically connecting a base, i.e. an intrinsic base to be formed by a following process, with the extrinsic base 24, as shown in FIG. 4F.

Figure 4G:
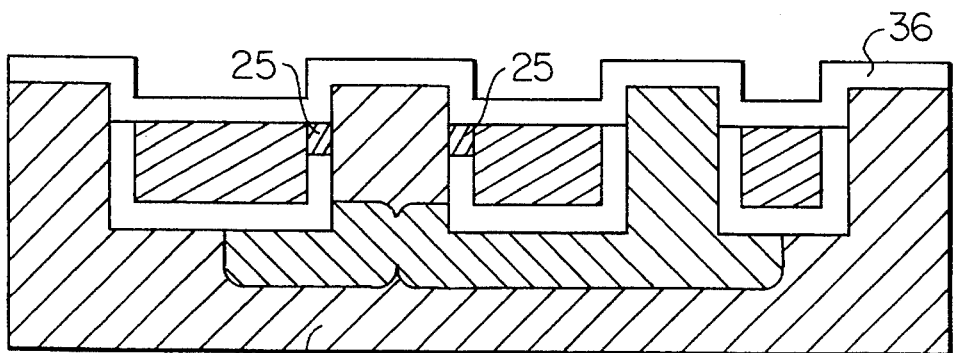
Figure 4H:
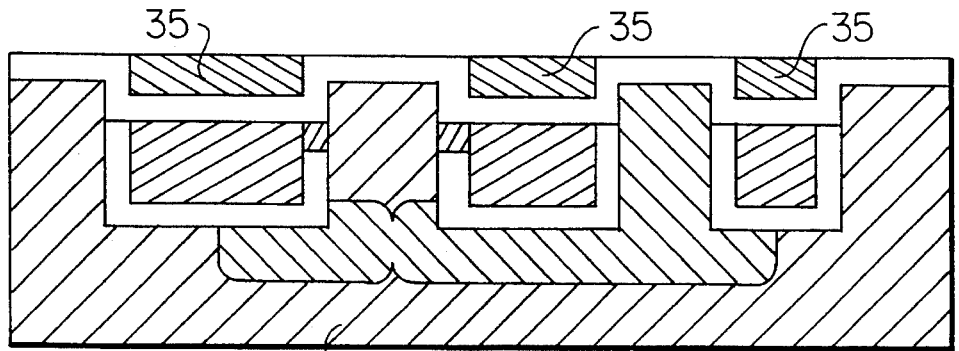

Subsequently, after formation of an oxide layer 36 as shown in FIG. 4G, a polysilicon layer 35 is deposited thereon, and then a chemical-mechanical polishing is performed using the oxide layer 36 as a polishing stopper to obtain a planarized surface, as shown in FIG. 4H.

Figure 4I:
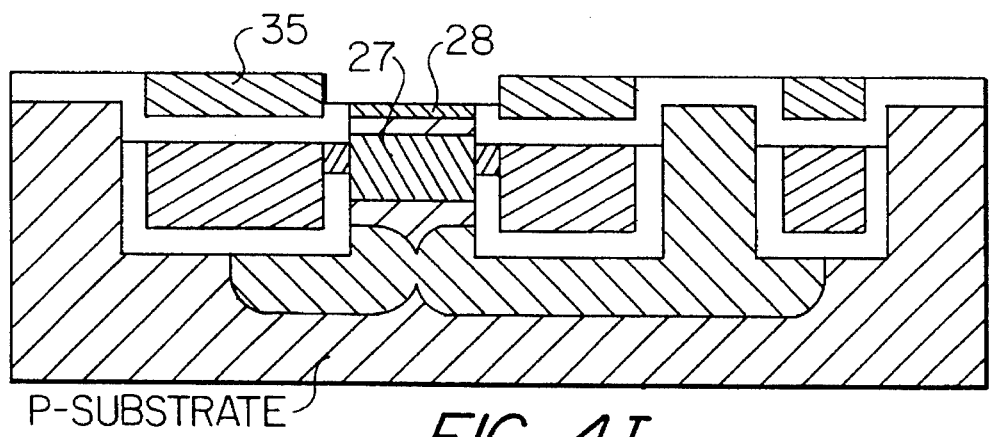

In FIG. 4I, After removal of only the oxide layer 36 formed upward the first pillar structure 10, an injection of a p-type impurity is performed to form the intrinsic base 27 at a center portion of the first pillar structure 10. Then, the intrinsic base 27 is electrically connected with the extrinsic base 24'. Also, an n-type impurity is injected to the first pillar structure 10 to form an emitter region 28 (or collector) at an upper portion of the first pillar structure 10.

Figure 4J:
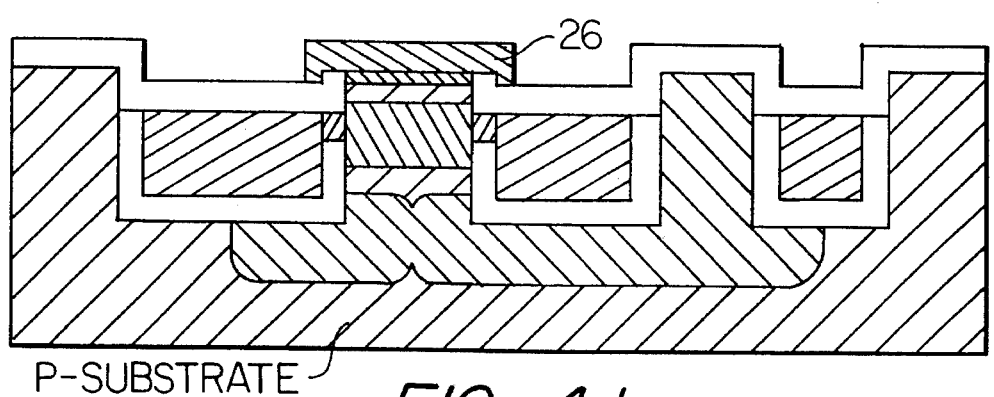

In addition, after removal of the polysilicon layer 35, a polysilicon layer 26 doped with an n-type impurity is formed on the emitter region (or collector) 28, as shown in FIG. 4J. The polysilicon layer 26 is formed wider than the emitter region 28.

Figure 4K:
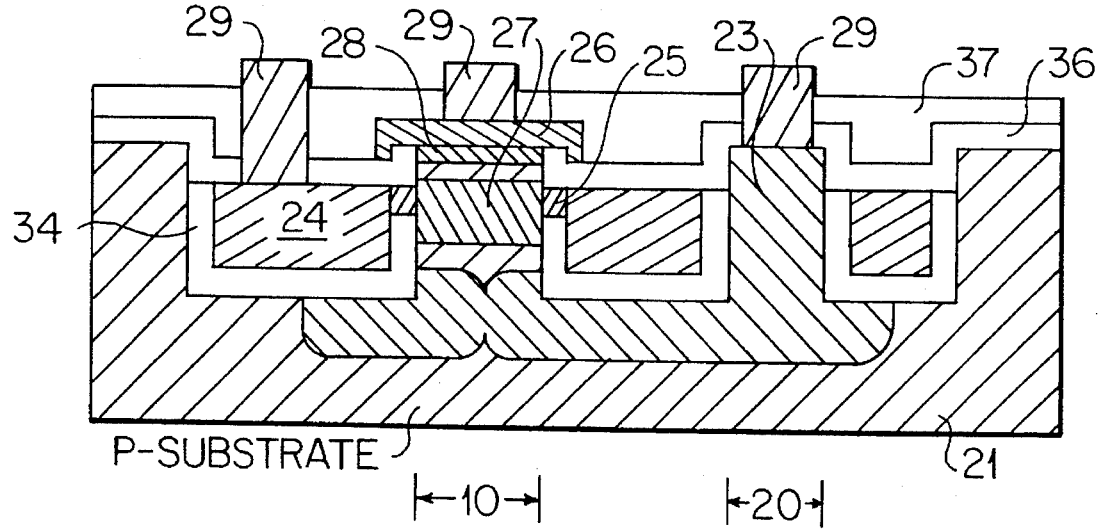

Finally, as shown in FIG. 4K, a passivation layer 37 is deposited thereon, and then a self-aligned contact hole formation is performed to form openings on each portion of the extrinsic base 24, the polysilicon layer 26 and the collector (or emitter) 23. Next, a metalization is performed to form wiring electrodes 29, and therefore the fabrication sequence of the pillar bipolar transistor is completed.

As described above, an intrinsic base of the pillar bipolar transistor fabricated by the method of the present invention can be further reduced in size, because an electrical connection portion is provided between the intrinsic base and an extrinsic base.

In the pillar bipolar transistor, also, an active region thereof can be formed in self-alignment, thereby allowing integration thereof to be enhanced. Parasitic junction capacitance between a base and a collector or between the base and an emitter can be reduced by forming the active region in self-alignment.

In addition, according to the method of the present invention, the pillar bipolar transistor having a good bidirectional operation characteristic can be fabricated.

Furthermore, because of reduction of the parasitic capacitance and enhancement of the good bidirectional operation characteristic, the pillar bipolar transistor is applicable to an integrated circuit necessary for a low-power consumption In the method, it is easy to perform a multi-layer interconnection because of a good planarization of a surface. Particularly, an extrinsic base region to be electrically connected with an intrinsic base region in the pillar and a self-aligned contact holes for interconnection of electrode can be easily formed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for fabricating a pillar bipolar transistor, the method comprising the steps of:

etching a silicon substrate of a first conductivity type using a first patterned insulating layer as a mask to form a first and a second pillar structures separated by a trench region therein;

injecting an impurity of a second conductivity type using a second patterned insulating layer as a mask to form a collector region under the first and second pillar structures and in the second pillar structure;

sequentially depositing a first oxide layer and a first polysilicon layer thereon;

polishing the first polysilicon layer using the first oxide layer as a polishing stopper;

removing a portion of the first polysilicon layer and a portion of the first oxide layer to define an extrinsic base region;

etching the first oxide layer formed on both sides of the first pillar structure to a predetermined depth to define a connecting portion and forming a buried polysilicon therein to form the connecting portion;

sequentially depositing a second oxide layer and a second polysilicon layer thereon;

polishing the second polysilicon layer using the second oxide layer as a polishing stopper;

removing only the second oxide layer formed on or over the first pillar structure to expose a surface of the first pillar structure;

injecting an impurity of the first conductivity type in the first pillar structure to form a base region at a center portion thereof;

injecting an impurity of the second conductivity type to form an emitter region at an upper portion of the first pillar structure;

depositing a third polysilicon layer on the emitter region, the third polysilicon layer being formed wider than the emitter region; and forming self-aligned contact holes to form electrodes.

2. The method according to claim 1, wherein the step of etching the silicon substrate is performed using a difference of etching rate between the first patterned insulating layer and the silicon substrate.

3. The method according to claim 1, wherein the step of injecting the impurity of the second conductivity type is performed using a diffusion difference between the second patterned insulating layer and the silicon substrate.

4. The method according to claim 1, wherein the step of polishing the first polysilicon layer is performed by a chemical-mechanical polishing utilizing a polishing speed difference between the first polysilicon layer and the first oxide layer.

5. A method for fabricating a pillar bipolar transistor, the method comprising the steps of:

etching a silicon substrate of a first conductivity type using a first patterned insulating layer as a mask to form a first and a second pillar structures separated by a trench region therein;

injecting an impurity of a second conductivity type using a second patterned insulating layer as a mask to form an emitter region under the first and second pillar structures and in the second pillar structure;

sequentially depositing a first oxide layer and a first polysilicon layer thereon;

polishing the first polysilicon layer using the first oxide layer as a polishing stopper;

removing a portion of the first polysilicon layer and a portion of the first oxide layer to define an extrinsic base region;

etching the first oxide layer formed on both sides of the first pillar structure to a predetermined depth to define a connecting portion and forming a buried polysilicon therein to form the connecting portion;

sequentially depositing a second oxide layer and a second polysilicon layer thereon;

polishing the second polysilicon layer using the second oxide layer as a polishing stopper;

removing only the second oxide layer formed on or over the first pillar structure to expose a surface of the first pillar structure;

injecting an impurity of the first conductivity type in the first pillar structure to form a base region at a center portion thereof;

injecting an impurity of the second conductivity type to form a collector region at an upper portion of the first pillar structure;

depositing a third polysilicon layer on the collector region, the third polysilicon layer being formed wider than the collector region; and forming self-aligned contact holes to form electrodes.

* * * * *